United States Patent
Suga et al.

(10) Patent No.: US 12,351,511 B2
(45) Date of Patent: Jul. 8, 2025

(54) METHOD FOR BONDING SUBSTRATE, TRANSPARENT SUBSTRATE LAMINATE, AND DEVICE PROVIDED WITH SUBSTRATE LAMINATE

(71) Applicants: iSABers Japan Co., Ltd., Tokyo (JP); Tadatomo Suga, Nakano-ku (JP)

(72) Inventors: Tadatomo Suga, Nakano-ku (JP); Yoshiie Matsumoto, Shinjuku (JP)

(73) Assignees: iSABers Japan Co., Ltd., Tokyo (JP); Tadatomo SUGA, Nakano-ku (JP)

( * ) Notice: Subject to any disclaimer, the term of this patent is extended or adjusted under 35 U.S.C. 154(b) by 1114 days.

(21) Appl. No.: 16/958,955

(22) PCT Filed: Dec. 21, 2018

(86) PCT No.: PCT/JP2018/047204
§ 371 (c)(1),
(2) Date: Sep. 9, 2020

(87) PCT Pub. No.: WO2019/131490
PCT Pub. Date: Jul. 4, 2019

(65) Prior Publication Data
US 2021/0017075 A1   Jan. 21, 2021

(30) Foreign Application Priority Data
Dec. 28, 2017   (JP) ................. 2017-254137

(51) Int. Cl.
*B32B 41/00*   (2006.01)
*B32B 17/06*   (2006.01)
(Continued)

(52) U.S. Cl.
CPC .............. *C03C 27/10* (2013.01); *B32B 17/06* (2013.01); *B32B 37/24* (2013.01);
(Continued)

(58) Field of Classification Search
CPC . C03C 27/10; C03C 17/245; C03C 2217/214; C03C 2218/152;
(Continued)

(56) References Cited

U.S. PATENT DOCUMENTS 9,331,305 B2   5/2016   Suga et al.
2014/0334006 A1*  11/2014   Adib .................... C03C 17/006
359/580

(Continued)

FOREIGN PATENT DOCUMENTS

CN   104412706 A   3/2015
CN   106104320 A   11/2016
(Continued)

OTHER PUBLICATIONS

Japanese Office Action issued Aug. 31, 2021 in Japanese Patent Application No. 2017-254137 (submitting unedited computer generated English translation only), 13 pages.

(Continued)

*Primary Examiner* — Michael N Orlando
*Assistant Examiner* — Joshel Rivera
(74) *Attorney, Agent, or Firm* — Oblon, McClelland, Maier & Neustadt, L.L.P.

(57) ABSTRACT

Methods of bonding substrates are provided, including forming a thin film of a metal oxide on a bonding surface of both or either of a pair of substrates, at least one of which is a transparent substrate, and contacting the bonding surfaces of the pair of substrates with each other via the thin film of the metal oxide.

20 Claims, 2 Drawing Sheets

(51) Int. Cl.
  *B32B 37/24*  (2006.01)
  *B32B 38/00*  (2006.01)
  *C03C 27/10*  (2006.01)
  *H01L 23/00*  (2006.01)
  *C03C 17/245*  (2006.01)
  *C23C 14/46*  (2006.01)
  *C23C 16/455*  (2006.01)

(52) U.S. Cl.
  CPC ...... *B32B 38/0008* (2013.01); *B32B 38/0036* (2013.01); *H01L 24/83* (2013.01); *B32B 2037/246* (2013.01); *B32B 2255/20* (2013.01); *B32B 2307/412* (2013.01); *B32B 2309/02* (2013.01); *B32B 2310/0875* (2013.01); *B32B 2311/00* (2013.01); *B32B 2315/08* (2013.01); *C03C 17/245* (2013.01); *C03C 2217/214* (2013.01); *C03C 2218/152* (2013.01); *C03C 2218/154* (2013.01); *C03C 2218/32* (2013.01); *C23C 14/46* (2013.01); *C23C 16/45525* (2013.01); *H01L 2224/83048* (2013.01); *H01L 2224/8309* (2013.01); *H01L 2224/83948* (2013.01)

(58) Field of Classification Search
  CPC .......... C03C 2218/154; C03C 2218/32; C03C 17/23; C03C 2218/1525; C03C 27/042; C03C 27/06; B32B 17/06; B32B 37/24; B32B 38/0008; B32B 38/0036; B32B 2037/246; B32B 2255/20; B32B 2307/412; B32B 2309/02; B32B 2310/0875; B32B 2311/00; B32B 2315/08; B32B 7/12; B32B 17/10; B32B 27/08; B32B 27/281; B32B 27/325; B32B 27/36; B32B 27/365; B32B 2255/10; B32B 2309/68; B32B 2419/00; B32B 2457/12; B32B 2457/206; B32B 37/26; H01L 24/83; H01L 2224/83048; H01L 2224/8309; H01L 2224/83948; C23C 14/46; C23C 16/45525; C23C 14/0036; C23C 14/022; C23C 14/042; C23C 14/081; C23C 14/56; C23C 14/5833; C23C 14/08; C23C 16/455; B29C 59/14; B29C 65/8223; B29C 66/00141; B29C 66/00143; B29C 66/00145; B29C 66/0242; B29C 66/028; B29C 66/034; B29C 66/1122; B29C 66/45; B29C 66/5326; B29C 66/71; B29C 66/73366; B29C 66/7465; B29C 66/83241; B29C 66/919; B29C 66/929; B29C 66/949; B29C 65/02; H10K 71/50; H10K 77/10; H10K 50/00; Y02E 10/549; H05B 33/02; H05B 33/04
  USPC .................... 156/60, 64, 350, 351, 378, 379
  See application file for complete search history.

(56) References Cited

U.S. PATENT DOCUMENTS

| | | |
|---|---|---|
| 2015/0086794 A1 | 3/2015 | Akita et al. |
| 2015/0104656 A1 | 4/2015 | Suga et al. |
| 2015/0115278 A1 | 4/2015 | Ichikawa |
| 2015/0171365 A1 | 6/2015 | Suga et al. |
| 2015/0303356 A1 | 10/2015 | Sanga et al. |
| 2016/0300987 A1 | 10/2016 | Sanga et al. |
| 2017/0075044 A1 | 3/2017 | Watanabe et al. |
| 2017/0248280 A1 | 8/2017 | Ichikawa |
| 2018/0097147 A1 | 4/2018 | Ichikawa |
| 2018/0151268 A1* | 5/2018 | Matsuura .............. B32B 17/061 |
| 2019/0047258 A1* | 2/2019 | Suematsu .............. H10K 50/81 |

FOREIGN PATENT DOCUMENTS

| | | | |
|---|---|---|---|
| JP | 2004-337927 A | 12/2004 | |
| JP | 2008-207221 A | 9/2008 | |
| JP | 2009-199902 A | 9/2009 | |
| JP | 2014-123514 A | 7/2014 | |
| JP | 2015-111596 A | 6/2015 | |
| JP | 2015-111659 A | 6/2015 | |
| JP | 2015-207615 A | 11/2015 | |
| JP | 2017-157611 A | 9/2017 | |
| KR | 10-2016-0023463 | 3/2016 | |
| WO | WO 2013/154107 A1 | 10/2013 | |
| WO | WO 2013/187500 A1 | 12/2013 | |
| WO | WO-2017145417 A1 * | 8/2017 | ............. B32B 15/08 |

OTHER PUBLICATIONS

Office Action issued Jan. 4, 2023, in corresponding European Patent Application No. 18 897 427.3, 5 pages.
Extended European Search Report issued Aug. 21, 2018 in European Patent Application No. 18897427.3, 6 pages.
Combined Chinese Office Action and Search Report issued Nov. 22, 2021 in Chinese Patent Application No. 201880087846.X, 9 pages.
Japanese Office Action issued Aug. 31, 2021 in Japanese Patent Application No. 2017-254137, 10 pages.
Takagi, H., et al., "Room-temperature Bonding of Oxide Wafers by Ar-beam Surface Activation", ECS Transactions, vol. 16, No. 8, 2008, pp. 531-537.
International Search Report issued on Mar. 19, 2019 in PCT/JP2018/047204 filed on Dec. 21, 2018, 2 pages.
Office Action issued Feb. 19, 2024, in Korean Patent Application No. 10-2020-7021853 (with English-language Translation).

* cited by examiner

METHOD FOR BONDING SUBSTRATE, TRANSPARENT SUBSTRATE LAMINATE, AND DEVICE PROVIDED WITH SUBSTRATE LAMINATE

CROSS-REFERENCE TO RELATED APPLICATIONS

The present application is the national stage of international application PCT/JP2018/047204, filed on Dec. 21, 2018, and claims the benefit of the filing date of Japanese Appl. No. 2017-254137, filed on Dec. 28, 2017, the content of each of which is incorporated by reference.

TECHNICAL FIELD

The present disclosure relates to methods of bonding substrates. More particularly, the present invention relates to methods of forming a laminated body (laminate, stack) of transparent substrates so as to substantially enjoy the light transmittance of the transparent substrates themself.

BACKGROUND OF THE INVENTION

As a substrate bonding method, methods in which substrate surfaces are activated by energy particle irradiation and bonded together is known. One such technique is called room temperature bonding. Substrate bonding techniques using such a surface activation treatment are currently used in a wide variety of applications. As a non-limiting example, all or part of the bonding process may be used to form a laminated body where high temperature processes are not suitable or are desired to be avoided. For example, such techniques may be used for bonding of substrates of different materials or bonding of substrates of a material where atomic diffusion is unlikely to occur except at high temperatures.

SUMMARY OF INVENTION

Problems to be Solved by the Invention

The present disclosure provides a method of bonding substrates, the method comprising: forming a thin film of a metal oxide on a bonding surface of both or either of a pair of substrates, at least one of which is a transparent substrate; and bonding the bonding surfaces of the substrates in contact with each other via the thin film of a metal oxide.

DETAILED DESCRIPTION OF THE INVENTION

Optoelectronic devices represented by a display (display element) as an example of a device using a transparent substrate often have a configuration where a light emitting element is affixed to the glass as a take-out component of the light. Here, generally, both are affixed via an adhesive film. By way of a non-limiting example, organic electroluminescent (hereinafter, also referred to as "organic EL") devices are configured with a polymer-covered organic EL device affixed to a protective glass. Also in the flexible organic EL, the organic EL element is covered with a polymer, and a polarizing plate or the like is also made of a polymer.

However, there is no technique for directly attaching a polymer substrate or a polymer film to a protective glass having a function to protect the device such as an organic EL element. Therefore, the device and the protective glass have been attached indirectly via an optically clear adhesive sheet (hereinafter also referred to as "OCA"). Here, a component called OCA is a cost factor. Also, products using OCA are not suitable for applications in situation where organic matters cannot be used, such as under radiation.

In addition to the fields of displays, there are many demands to bond glass together without compromising the light transmittance. Usually, an adhesive formed of an organic material is used to bond glasses with each other. However, adhesives have been regarded as one of the causes of lowering the light transmittance. Further, since an organic material as an adhesive is formed by coating, bubbles are easily generated at the bonding interface, which affects the quality of the bonding interface.

Therefore, it has been considered to bond a light-emitting element covered with a polymer to a glass having high transparency, by applying a direct bonding method such as room temperature bonding. However, it has been difficult to bond $SiO_2$, which is a main component of glasses, by energy particle irradiation.

A method of bonding substrates included in the present disclosure comprises forming a thin film of a metal oxide on a bonding surface of both or either of a pair of substrates, at least one of which is a transparent substrate, and contacting the bonding surfaces of the pair of substrates with each other via the thin film of the metal oxide. The metal oxide is transparent to visible light, and the metal oxide formed by, for example, a sputtering method or the like has a relatively strong bonding force. Therefore, it has both transmittance and bonding property.

<Substrate to be Bonded>

"Transparent substrate" refers to a substrate having a high transmittance of light including visible light. For example, the visible light transmittance may be 90% or higher. The "transparent substrate" may be a glass containing $SiO_2$, a tempered glass, or a substrate having polymer or the like as a base material or containing polymer or the like. While the methods of bonding substrates disclosed in the present disclosure have numerous advantages. One advantage is that substrates containing $SiO_2$, which previously could not be bonded without compromising or significantly degrading transparency, can be bonded while maintaining the high optical transmittance.

One or both of the substrates bonded to the transparent substrate may be a transparent substrate. The substrates to be bonded may be a pair of substrates, a pair of transparent substrates, one of which may be a transparent substrate and the other of which may be a translucent or opaque substrate.

Both of the pair of substrates to be bonded may be glass substrates or polymer substrates. One of the pair of substrates to be bonded may be a glass substrate and the other may be a polymer substrate. The polymer substrate may be a substrate substantially consisting of a polymer material. The bonding surface of at least one of the substrates to be bonded may substantially consist of a polymer material.

Methods of bonding the substrates may comprise providing a substrate used for bonding or a transparent substrate and another substrate, and may comprise providing a pair of substrates at least one of which is a transparent substrate.

One or both of the substrates to be bonded may be a substrate consisting mainly of a polymeric material, or a polymeric substrate. The polymer material substrate may be a plastic substrate or a flexible substrate. The polymer material may be PEN (polyethylene naphthalate), PET (polyethylene terephthalate), other polyester materials, PI (polyimide), COP (cycloolefin polymer), PC (precarbonate), and is not limited thereto, and may be any other polymer or plastic material. The substrate may include a POL (polarizing filter). Substrates may substantially consist of a polymeric material, and may comprise a polymeric material, and may consist of a polymeric material and other materials or members. The polymer substrate may be a transparent substrate.

The substrates to be bonded may be circular or rectangular, or may be in a form of a tape.

One of the substrates to be bonded may comprise an optical element. The optical element may be or comprise a light emitting element, a light receiving element, and may comprise other optical, optoelectronic, or electronic elements, circuits, and materials. Substrates to be bonded may comprise a layer of an optical element, or may comprise a layer of an optical element and a layer of a polymer. For example, the substrate may be configured by comprising a layer containing an optical element or an optical element layer, and a layer containing a polymer material or a polymer layer.

One of the substrates to be bonded may be configured by comprising an optical element layer including an optical element, and a polymer layer including a polymer material covering the optical element layer. The surface of the polymer layer may be a bonding surface.

In the final product, for example, when the optical element is a light emitting element, all substrates and layers through which light emitted from the light emitting element to the outside of the product passes are preferably transparent. For example, when the optical element is a light receiving element, all substrates and layers through which light incident from the outside of the product passes until it reaches the light receiving element are preferably transparent. In the final product including an optical element, the term "transparent" means that the product is transparent to such an extent that from the light emitted from the light-emitting element, a practically sufficient amount of light is extracted to the outside or to such an extent that a practically sufficient amount of light among the light incident from the outside is detected by the light-receiving element.

On the other hand, it is preferable that the light transmittance of the transparent substrate laminate formed after bonding (hereinafter referred to as "post-bonding light transmittance") has a sufficient light transmittance in the application of the final product. For example, it is preferable that the post-bonding light transmittance is 90% or higher of the light transmittance (hereinafter referred to as "pre-bonding light transmittance") for all of the plurality of substrates on which the substrates in the pre-bonding state are just stacked as they are. The post-bonding light transmittance may be 95% or higher of the pre-bonding light transmittance. The post-bonding light transmittance may be 97% or higher, 98% or higher, or 99% or higher of the pre-bonding light transmittance.

<Metal Oxide>

The metal of the metal oxide may be selected from alkali metals: Li, Na, K, Rb, Cs, alkaline earth metals: Ca, Sr, Ba, Ra, magnesium group elements: Be, Mg, Zn, Cd, Hg, aluminum group elements: Al, Ga, In, rare earth elements: Y, La, Ce, Pr, Nd, Sm, Eu, tin group elements: Ti, Zr, Sn, Hf, Pb, Th, iron group elements: Fe, Co, Ni, earth elements: V, Nb, Ta, chromium group elements: Cr, Mo, W, U, manganese, manganese, magnesium group elements: Mg, In, rare earth elements: Y, La, Ce, Pr, Nd, Sm, Eu, and tin group elements: Ru, Pr, Ru, Pr group metals. The metal may consist of one type of metal, and may comprise a plurality of metals, or may be an alloy. The metal may be Si, so-called metallic silicon. The metal may be a metal other than silicon.

The metal oxide may be a metal oxide of stoichiometric composition in some embodiments, and in other embodiments, may be a non-stoichiometric composition, e.g., the amount of metal may be large or small relative to the amount of oxygen. The metal oxide may be a mixture of metal and oxygen. The binding of metal and oxygen may be different from, or may comprise bindings that are different from, that of the metal oxide of stoichiometric composition.

<Formation of Metal Oxide>

Forming a thin film of metal oxide on the bonding surface of the substrate may be performed by a plasma CVD method, a sputtering method, a vapor deposition method, an ALD (atomic layer deposition) method, or a (reactive ion etch) RIE method. However, forming a thin film of a metal oxide is not limited to these methods, and may be performed using other methods. Forming a thin film of metal oxide on the bonding surface of the substrate may be performed by a sputtering method, or a method or steps including a sputtering method. The sputtering method may be an ion beam sputtering method or an ion beam assisted sputtering method. It is considered that the metal oxide formed by the ion beam sputtering method has relatively low crystallinity, relatively many crystal defects, relatively many surfaces exposed at atomic bells, and so-called dangling bonds. Therefore, it is considered that the surface is in an activated state with relatively high activity, facilitating the bonding. However, this physical consideration is an inference, and the present disclosure is not limited to this mechanism.

In some embodiments, forming a thin film of metal oxide on the bonding surface of the substrate may be performed by an ion beam assisted sputtering method. The method may comprise forming a metal oxide on the target substrate by a sputtering method using a metal as a target and a mixed gas substantially consisting of an inert gas and oxygen. In another embodiment, the sputtering process may be performed with a metal target and a gas mixture substantially consisting of nitrogen gas and oxygen. By irradiating the metal target with the mixed gas and sputtering the metal, a mixture of metal and oxygen, an oxide of the metal, or a metal oxide can be formed on the bonding surface.

In another embodiment, forming a thin film of metal oxide on the bonding surface of the substrate may comprise using a metal as target, sputtering substantially with an inert gas toward the bonding surface, and guiding oxygen gas to the bonding surface from another direction.

The inert gas may be a rare gas. The rare gas may be any one of helium (He), neon (Ne), argon (Ar), krypton (Kr), xenon (Xe), and radon (Rn), and may be a plurality of mixed gases therein. The inert gas may be in particular argon (Ar).

The metal used for the sputtering target may be aluminum (Al). A thin film of aluminum oxide such as $Al_2O_3$ can be formed by sputtering an aluminum target using a mixed gas of a rare gas such as argon and oxygen gas.

The oxide of aluminum in the thin film may be $Al_2O_3$ of stoichiometric composition, a non-stoichiometric composition, or a mixture thereof. In the formed metallic oxide, the combined form of aluminum and oxygen may differ from that of the stoichiometric $Al_2O_3$ and may comprise different forms.

Forming a thin film of metal oxide on the bonding surface of the substrate may comprise using a metal oxide as target, sputtering this target, and forming a metal oxide on the substrate. By way of non-limiting examples, the metal oxide as target may be aluminum oxide ($Al_2O_3$).

The gas used for the sputtering may be a rare gas or a nitrogen gas, and may be a mixture thereof, and may be a rare gas or a gas containing nitrogen gas and other gases. The gas mixture used for sputtering may be substantially composed of argon gas and oxygen gas.

The flow rate of the oxygen gas contained in the mixed gas may be substantially greater than or equal to 3%, 4%, 5%, 6%, 7%, 8%, 9%, or 10%, with respect to the flow rate of the mixed gas or the total flow rate. The mixed gas may contain another argon gas, and may contain a rare gas other than argon gas. When the mixed gas contains a gas different from argon gas, or when the sputtering characteristics are substantially different or remarkably different due to an influence of an apparatus or an environment, an appropriate flow rate of the oxygen gas may be selected. For example, if the sputtering rate of the rare gas is smaller than that in the case where only argon gas is used, the flow rate ratio of oxygen may be smaller than 5%, for example, 4% or 3% or smaller. Conversely, for example, if the sputtering rate of the rare gas is larger than that in the case where only argon gas is used, the flow rate ratio of oxygen may be larger than 5%, for example, 6% or 7% or greater.

The substrate to be bonded may be a glass substrate and a glass substrate, a glass substrate and a polymer material (polymer) substrate, and a polymer substrate and a polymer substrate. When bonding surfaces of glass and glass are bonded or when bonding surfaces of a polymer and a polymer are bonded, a metal oxide film may be formed on either one or both of them. When bonding surfaces of glass and a polymer are bonded, when a metal oxide film is formed on either one of them, a metal oxide film may be formed on the polymer. Thereby, the bonding strength can be improved in many cases.

The thickness of the metal oxide film to be formed may be about 0.1 nm to about 10 nm, and may be equal to or greater than 0.1 nm, 0.2 nm, 0.3 nm, 0.4 nm, 0.5 nm, 1 nm, 2 nm, 3 nm, 4 nm, 5 nm, 6 nm, 7 nm, 8 nm, or 9 nm. The thickness of the metal oxide film to be formed may be equal to or smaller than 10 nm, and may be equal to or smaller than 9 nm, 8 nm, 7 nm, 6 nm, 5 nm, 4 nm, 3 nm, 2 nm, or 1 nm. The thickness of the metal oxide layer in the substrate laminate formed by bonding may be on the order of approximately 0.1 nm to 20 nm.

<Surface Activation Treatment>

The surface activation treatment may comprise irradiating the surface of the oxide of the metal with energy particles.

The energetic particles may be generated by accelerating ions or neutral atoms of gas particles or atoms used, or a mixture thereof, using a particle beam source, such as an ion beam source or a fast atom beam (FAB) source. The irradiation of the energy particles may be performed using a plasma source.

A particle beam source can be used to give a predetermined kinetic energy to the particle. The particle beam source operates in a vacuum, e.g. under a pressure of $1 \times 10^{-5}$ Pa or lower. The vacuum pump to make a relatively high vacuum efficiently can evacuate the material removed from the surface of the metal region out of the atmosphere. Thus, it is possible to suppress the adhesion of undesirable substances to the exposed new surface. Furthermore, the particle beam source can operate at a relatively high acceleration voltage, so that high kinetic energy can be given to the particles. Therefore, it is considered that the surface layer can be efficiently removed, and the new surface can be activated.

As a neutral atomic beam source, a fast atom beam source (FABs, Fast Atom Beam) can be used. A fast atom beam source (FAB) is typically configure to generate a plasma of gas and applies an electric field to the plasma, extract positive ions of particles ionized from the plasma, and pass them through an electron cloud to neutralize them. In this case, for example, in the case of argon (Ar) as rare gas, the power supplied to the fast atom beam source (FAB) may be set to 1.5 kV (kilovolts), 15 mA (milliamperes), or may be set to a value between 0.1 and 500 W (watts). For example, when a fast atom beam source (FAB) is operated at 100 W (watts) to 200 W (watts) and irradiate the surface to be bond with a fast atom beam of argon (Ar) for about 2 minutes, the oxide, contaminant, etc. (surface layer) can be removed to expose the new surface.

As the ion beam source, a cold cathode type ion source can be used.

The ion beam source may be a line type cold cathode type ion beam source. A line-type particle beam source is a particle beam source having a line-type (linear) or elongated particle beam emission aperture from which a particle beam can be emitted in a line-type (linear) fashion. The length of the radiation port is preferably larger than the diameter of the substrate to which the particle beam is irradiated. If the substrate is not circular, the length of the radiation aperture is preferably greater than the maximum dimension of the substrate as it is moved with respect to the particle beam source, in the direction in which the radiation aperture that is elongated.

Particle beams emitted from a line-type particle beam source irradiate a linear or elongated region on the substrate at a particular point of time during the surface activation process. Then, while radiating the particle beam from the line-type particle beam source toward the substrate, the substrate support is scanned in a direction perpendicular to the direction in which the radiation port extends. As a result, the irradiated area of the linear particle beam passes over all bonding region of the substrate. Once the line-type particle beam source has passed over the substrate, the entire substrate has been substantially uniformly irradiated by the particle beam, and the surface is activated.

The line type particle beam source is suitable for irradiating a surface of a substrate having a relatively large area with a particle beam, relatively uniformly. The line-type particle beam source can also irradiate the particle beam relatively uniformly, corresponding to various shapes of the substrate.

The energy particles may be a mixed gas substantially consisting of a rare gas and oxygen gas, and may be the same mixed gas and may comprise other gases. When an energy particle beam is irradiated using only a rare gas without containing an oxygen gas, oxygen may be deficient in the metal in the vicinity of the surface of the metal oxide. In such a case, the transmittance of light such as visible light may be lowered by the relatively increased amount of metal. It is presumed that this is because it is absorbed in a region containing a relatively large amount of this metal. Therefore, it is considered that if the energy particle beam used to irradiate the bonding surface contains oxygen, this oxygen is bonded to the metal oxide surface, thereby avoiding or reducing the lack of oxygen. Thus, it is considered to be possible to obtain the light transmittance of the laminate of the transparent substrates which are sufficiently bonded.

The energy particles may be a rare gas and may comprise a rare gas. The noble gas may be argon and may be other noble gases. The energy particles may be neutral atoms or ions, and further may be radical species, and even a group of particles in which they are mixed.

"Surface activation" means a treatment or process performed on a surface that would not be substantially joined or bonded when the surface were brought into contact without such a treatment or the like, wherein the surfaces after such a treatment or the like will result in a desired or substantially effective bonding when they are brought into contact. The laminate formed by bonding the substrates after a surface activation treatment may or may not be subjected to heating, light treatment, or may be subjected to no after-treatment.

Depending on the operating conditions of each plasma or beam source, or the kinetic energy of the particles, the removal rate of the surface layer can vary. Therefore, it is necessary to adjust each condition including the treatment time of the surface activation treatment. For example, by using a surface analyzing method such as Auger electron spectroscopy (AES, Auger Electron Spectroscopy) or X-ray photoelectron spectroscopy (XPS, X-ray Photo Electron Spectroscopy), a time period after which the presence of oxygen or carbon contained in the surface layer cannot be confirmed or a longer time period may be employed as the treatment time of the surface activation treatment.

<Bonding>

The bonding may comprise contacting the bonding surfaces of the substrates with each other via a thin film of surface-activated metal oxide. When contacting, a force may be applied to the substrate from the other side of the bonding surface or from another surface then the bonding surface. For example, a force may be applied from an outside of the substrate in a direction perpendicular to the bonding surface. In some embodiments, the pressurization may apply a force that is substantially uniform across the bonding interface. In another embodiment, the pressurization may be performed at different timings relative to different portions of the bonding surfaces in contact. The strength of the force during pressurization may be constant over time or variable. The pressurization may be performed at different timings with respect to the respective portions of the bonding surface. With respect to the substrates in contact, by moving and sliding the pressurizing device the pressurization may be performed sequentially over the bonding surface. The pressurizing device may have a roller-shaped pressurizing member.

In the method of bonding substrates included in the present disclosure, the processes from forming a metal oxide layer on a substrate on a bonding surface to contacting or bonding a pair of substrates may be consistently performed under a vacuum or a low pressure atmosphere, or may be performed without breaking a vacuum or a low pressure atmosphere. The atmosphere in a vacuum or under a low pressure may be an atmosphere having an atmospheric pressure of $10^{-16}$ Pa or less. Alternatively, the substrate may be temporarily removed from the vacuum after the formation of the metal oxide layer. But in such a case, the dummy substrate may be temporarily bonded to the bonding surface to avoid exposure of the bonding surface to the atmosphere. After being returned to the vacuum, the dummy substrate may be removed, and the bonding surfaces may be brought into contact in a vacuum. The atmosphere under vacuum or under low pressure may include this. By carrying out these processes in a vacuum, it is possible to avoid adhesion, adsorption, or oxidation or hydroxylation of an unnecessary substance to a bonding surface, to efficiently activate a surface, to maintain or suppress as much as possible the activity of the activated surface, and to avoid or reduce the occurrence of a portion which is not bonded.

<Heat Treatment>

The method of bonding substrates included in the present disclosure may further comprise heating the laminate after bonding. The temperature of heating may be 100° C., 200° C., may be 100° C. or higher, and may be equal to or lower than 210° C., 220° C. The temperature of heating may be equal to or higher than 100° C. or 150° C. The heating temperature may be equal to or lower than 400° C., 300° C., 250° C., 225° C., 220° C., 210° C., 200° C. or 150° C. The temperature of heating may be substantially 100° C., 150° C., 200° C. Heating may be performed simultaneously on the entire substrate or on a portion-by-portion basis of the substrate.

Forming the metal oxide layer on the bonding surface, performing the activation treatment, and bonding the pair of substrates may be performed substantially at or below the bonding interface temperature of 100° C. or 200° C., or may intentionally avoid a heat treatment.

<Substrate Surface Activation Treatment Before Film Formation>

The method of bonding substrates included in the present disclosure may further comprise irradiating the bonding surface of the substrate with energy particles prior to a film formation. An irradiation of the energy particles can activate the bonding surface of the substrate, and thereby increase the bonding strength between the bonding surface and the thin film formed thereon.

Example 1

The glass substrate was bonded using the method according to the present disclosure, and its light transmittance and bonding strength were evaluated.

Figure 1A:
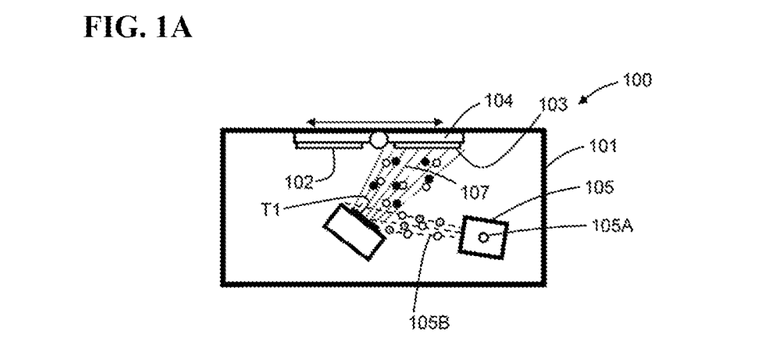
FIGS. 1A, 1B and 1C illustrate each step of a method of forming a laminate according to one embodiment, together with an apparatus configuration.

A bonding apparatus 100 shown in FIG. 1A includes a vacuum vessel 101, a substrate support 104 disposed inside the vacuum vessel 101 and movably supporting a first substrate 102 and a second substrate 103, a particle beam source 105 as a surface activation processing means, a metal target 106 for forming a thin film of a metal oxide, and a substrate support 104 as a bonding means having a rotation shaft 104A and a pressurizing means (not shown). With this configuration, a high-quality metal oxide can be formed on the substrates 102, 103 in a vacuum, and further, a surface activation treatment and a substrate bonding can be performed without breaking the vacuum, so that a bonding interface having high strength and few defects can be formed.

As shown in FIG. 1A, a vacuum pump (not shown) is connected to the vacuum vessel 101, and the degree of vacuum inside the vacuum vessel 101 can be maintained at a pressure of $1 \times 10^{-5}$ Pa or less. Further, the particle beam source 105 may be rotatable around the rotation axis 105A, and may sputter the metal material by accelerating the particle group 107 of the mixed gas of argon and oxygen toward the sputtering target 106. The particle beam source 105 is configured to emit a particle beam 105B of particles having a predetermined kinetic energy toward the surface of the first substrate 102 or the second substrate 103 according to the position of the substrate support 104, thereby performing surface activation treatment of the substrate surface. In order to form a metal oxide film only in a predetermined region or a bonding region on the substrate, a mask defining the predetermined region is disposed on the substrate (not shown).

Also, while the thin film 107 is being deposited, the substrate support 104 may be scanned to provide uniform deposition conditions over the first substrate 102 or the second substrate 103. The thickness of the metal oxide layer may be controlled stepwise by the number of scans with respect to the operating conditions of the predetermined particle beam source 105 and the predetermined placement positions of the particle beam source 105, the target 106, and the substrates 102, 103 in the vacuum vessel 101.

Figure 1B:
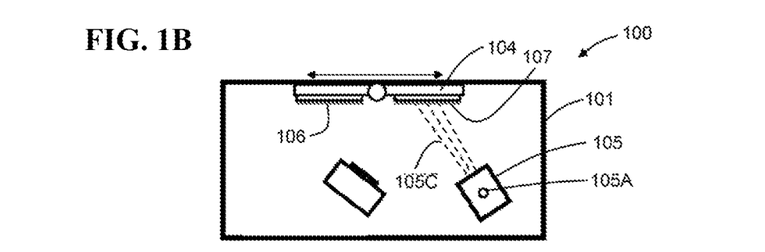

In this example, a glass substrate was used for both the first substrate 102 and the second substrate 103, and more particularly, alkali-free glasses (a OA10-G manufactured by Nippon Electric Glass Co., Ltd.) of 80 mm square were used. The glass substrates 112 and 113 were introduced into the vacuum vessel 101, the atmosphere in the vessel was set to a vacuum atmosphere of $10^{-5}$ Pa or less, and the evacuation was continued with the same evacuation capability until the bonding was completed. Metal aluminum was placed as the target 106, and a linear cold cathode type ion beam source was used as the particle beam source 105, and was operated with a mixed gas of argon gas and oxygen gas at a supply rate of 80 sccm under the condition of 1.2 kV and 400 mA. Thereby, the particle beam 105B of the mixed gas was irradiated onto the target 106, and the particle group 107 containing the mixture of aluminum and oxygen was sputtered toward the bonding surfaces of both glass substrates. As a result, thin films of aluminum oxides 107, 108 were formed on the bonding surfaces of the glass substrates 102, 103 (FIG. 1B). The thickness was about 20 nm. However, the present disclosure is not limited to the above description for the mechanism of sputtering and the state of the sputtered particles 107 from the target 106 to the substrates 102, 103.

Thereafter, as shown in FIG. 1B, for the surface activation treatment, the particle beam source 105 was rotated around the rotation axis 105A, fixed at a position facing the first substrate 102 or the second substrate 103, and the same particle beam source 105 was used and operated at 1.3 kV and 400 mV at a supply amount of argon gas of 70 sccm and irradiate the surfaces of the aluminum oxide films 107, 108 formed on the substrates 102, 103 with the energy particle beam 105C. When the surface activation treatment is performed only on a predetermined region on the substrate, a mask defining the predetermined region is disposed on the substrate (not shown).

Figure 1C:
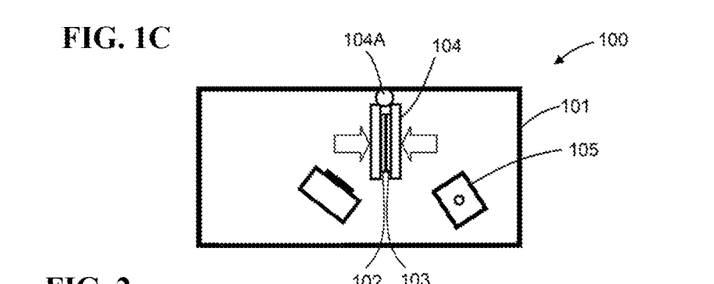

As shown in FIG. 1C, the substrate support 104 is configured to have a rotating shaft 104A provided between portions supporting the first substrate 102 and the second substrate 103 as bonding means. The substrate support 104 is configured so that the first substrate 102 and the second substrate 103 can be folded around the rotation axis 104A and face each other. As a result, as shown in FIG. 1C, the first substrate 102 and the second substrate 103 are brought into contact with each other by using a simple configuration, and the same pressure can be applied uniformly over almost the entire area of each other.

A pressurizing means (not shown) for applying a predetermined force from the outside of the folded substrate support 104 may be disposed so as to press the first substrate 102 and the second substrate 103 against each other during bonding. In the present example, the aluminum oxide thin films formed on both substrates and subjected to the surface activation treatment were brought into contact with each other via the thin films. After contact, a force of 5 kN was applied perpendicular to the interface for 5 minutes. Further, a heating means (not shown) may be disposed for heating the first substrate 102 and the second substrate 103 at a predetermined temperature, within a range that does not deteriorate the material of the substrate or the function of the electronic elements, at bonding. A pressurizing means (not shown) may be disposed for applying a predetermined force from the outside of the folded substrate support 104 so as to press the first substrate 102 and the second substrate 103 against each other at bonding. In addition, a heating means (not shown) may be disposed for heating at a predetermined temperature in a range that does not deteriorate the functions of the materials and the electronic elements included in the substrates 102, 103 and the metal oxides 107, 108 at bonding.

Figure 2:
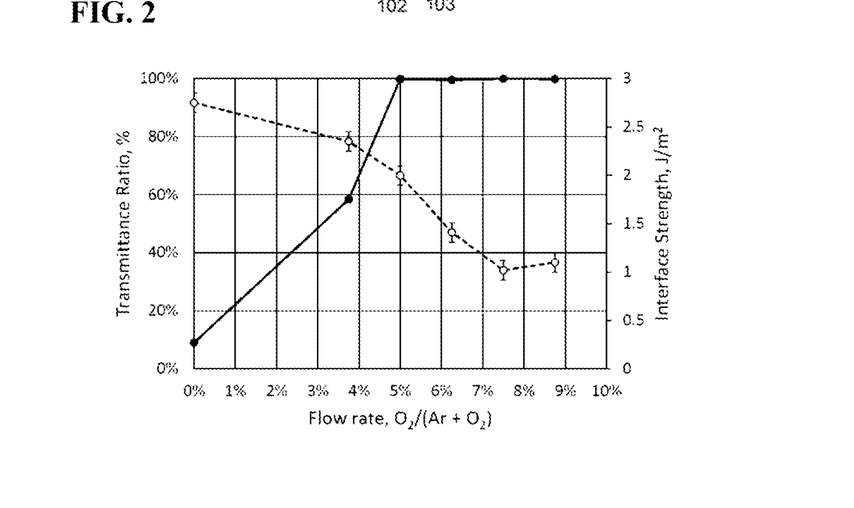
FIG. 2 shows the light transmittance and the bonding strength as experimental results of an example.

The flow rate ratio of the argon gas and the oxygen gas of the mixed gas supplied to the ion beam apparatus was varied when the metal aluminum target was irradiated as the sputtering film formation. FIG. 2 shows the values of light transmittance ratio and interface strength at the flow rate ratio of $Ar:O_2$=80:0 (0%), 77:3 (3.75%), 76:4 (5%), 75:5 (6.25%), 74:6 (7.5%), 73:7 (8.75%).

The light transmittance is a visible light transmittance measured by a commercially available visible light transmittance measuring instrument. Generally, it is a ratio between before and after transmission of a luminous flux in a visible light region or a wavelength region of about 360 nm to about 760 nm. In the present disclosure, the light transmittance measured for the substrates stacked in a state before performing the laminate forming method is referred to as pre-bonding light transmittance, and the light transmittance measured for the laminate after performing the substrate bonding method is referred to as post-bonding light transmittance. In the present disclosure, a ratio obtained by dividing the post-bonding light transmittance by the pre-bonding light transmittance is referred to as a light transmittance ratio. In this example, the pre-bonding light transmittance was 91.59%.

The strength of the bonding interface was measured by a blade insertion method. The blade insertion method is a technique in which a blade is inserted between two bonded substrates to peel them off, and the interface energy is evaluated from a length from a blade tooth tip to a peeling point. This is used for evaluation of the bonding strength of wafer bonding.

FIG. 2 shows the measured values of the light transmittance ratio (black circles) and the bonding strength (white circles), for each $Ar:O_2$ flow ratio for Al target sputtering during metal oxide film formation.

As the $Ar:O_2$ flow ratio for Al target sputtering increases from 0% to 5%, the light transmittance is increased. The measured values were obtained from 99.5% to 99.9% when the flow ratio exceeded 5%. That is, when the $Ar:O_2$ flow rate ratio was 5% or more, the light transmittance ratio was as extremely high as approximately 100%.

The $Ar:O_2$ flow rate ratio being 0% indicates that a thin film of substantially Al 100% is formed. In this case, it is considered that the metal thin film at the substrate bonding interface absorbs visible light, and therefore the light transmittance is relatively low. Conversely, it is considered that if the $Ar:O_2$ flow rate ratio is increased, the target aluminum is sputtered together with oxygen, so that the thin film formed on the substrate bonding surface is formed of a mixture of aluminum and oxygen or a thin film of an oxide of aluminum metal. Aluminum oxide is a substance that is transparent to visible light, such as sapphire or alumina.

Therefore, it is considered that a mixture of aluminum and oxygen formed partially contains alumina (aluminum oxide). This thin film of aluminum oxide may comprise a portion of a non-stoichiometric composition at the atomic level. Therefore, it is considered that the transmittance of the thin film is increased by increasing the proportion of aluminum oxide having high light transparency in the formed thin film as the $Ar:O_2$ flow rate ratio is increased. It is considered that when the $Ar:O_2$ flow rate ratio was at 5%, the thin film was almost made of aluminum oxide or alumina and the degree of oxidation approached the saturation. Alternatively, from the following trends in bonding strength, it is also considered that, even if the composition of the thin film itself did not reach the stoichiometric composition, the light transmittance almost reached the saturation. Thus, it is considered that the amount of visible light reached almost 100%. The mechanism of increase in light transmittance and saturation with increasing $Ar:O_2$ flow ratio is not limited to above and may be other mechanisms.

On the other hand, it was observed that the bonding strength tended to decrease with increasing each $Ar:O_2$ flow ratio for Al target sputtering. Aluminum, which is a metal, is more likely to transfer electrons and deform at the atomic level than aluminum oxide, which is an oxide, and therefore, is considered to be easily bonded to each other. Therefore, it is considered that as the ratio of metal at the thin film surface decreases, or as the ratio of oxide at the thin film surface increases, the bonding strength decreases. In this experiment, the bonding strength became almost constant at 7.5% or greater. This is considered to be because the proportion of the oxide on the surface of the thin film is almost saturated or a certain proportion is reached in view of an influence on the bonding strength. It is considered that the reason why the $Ar:O_2$ flow rate ratio, which becomes a substantially constant value, differs between the light transmittance and the bonding strength is that the ratio of the oxide in the thin film becomes insensitive. For example, in this experiment, it is considered that at the $Ar:O_2$ flow rate ratio of 5%, the ratio of the oxide in the thin film did not reach the limit, and the metallic aluminum component was present to some extent, but this did not affect the optical characteristics, or at least the effect was negligible in this measurement technique. In this disclosure, the discussion about the above-mentioned mechanism is just one reasoning, and it may not have been limited to above, and other mechanisms may be applied.

Bonding strength is also affected by the surface roughness of the metal oxide film. Generally, when the surface roughness of the metal oxide film is large, the bonding strength becomes low. Therefore, the absolute value of this experimental result is one measured value, and it can be understood that the tendency is relative.

Example 2

A method according to the present disclosure was used to bond a polymeric substrate.

As a substrate, a PEN (polyethylene naphthalate) film (Teonex®, manufactured by Teijin Co., Ltd.) and a PI (polyimide) film (Kapton®, manufactured by DuPont Co., Ltd.) were used. Various films were heated at temperatures from to 150° C. as a dehydration treatment for 1 h to 4 h prior to the metal oxide film formation. Bonded were PEN each other, PI each other, PEN and the glass substrate, and PI and the glass substrate, respectively. On either PEN or PI, an aluminum oxide film was formed in the same manner as in Example 1. However, the flow rate ratio $Ar:O_2=76:4$ of the mixed gas between the argon gas and the oxygen gas was supplied to the ion beam apparatus. Aluminum oxide film was not formed on the glass substrate. The same surface activation treatment as in Example 1 was conducted to the surfaces to be bonded. Thereafter the substrates were brought into contact with each other, and then a force of 5 kN or 10 kN was applied for 5 minutes.

The light transmittance ratio obtained by dividing the light transmittance after bonding by the light transmittance before bonding was 97% or greater, which was extremely high.

As can be understood from the experimental results in the present disclosure, the substrate laminate can be formed by the substrate bonding methods of the present disclosure. The substrate laminate may be a transparent substrate laminate.

The substrate laminate of the present disclosure may be a transparent substrate laminate comprising a first substrate, a second substrate, and a layer substantially consisting of a metal oxide between the first substrate and the second substrate, wherein the light transmittance of the substrate laminate is greater than or equal to 97% of the light transmittance of the first substrate and the second substrate when just stacked. In another embodiment, the light transmittance of the substrate laminate may be 98% or higher, 99% or higher, 99.1% or higher, 99.2% or higher, 99.3% or higher, 99.4% or higher, or 99.5% or higher, of the light transmittance when the first substrate and the second substrate are just stacked.

The substrate laminate of the present disclosure may be a transparent substrate laminate comprising a first substrate, a second substrate, and a layer of substantially metal oxide between the first substrate and the second substrate, the substrate laminate having a light transmittance ratio of 97% or higher. In another embodiment, the light transmittance may be 98% or higher, 99% or higher, 99.1% or higher, 99.2% or higher, 99.3% or higher, 99.4% or higher, or 99.5% or higher.

Compared to the light transmittance of light extracted from the light emitting element through the glass substrate when just stacking a transparent substrate such as a glass substrate and a substrate including a light emitting element such as an organic EL element, the light transmittance of light extracted from the light emitting element in the laminate through the glass substrate may be 97% or higher, 98% or higher, 99% or higher, 99.1% or higher, 99.2% or higher, 99.3% or higher, 99.4% or higher, or 99.5% or higher.

Substrate laminates included in the present disclosure may have a bonding strength or interface energy of 0.3 J/m2 or greater, 0.4 J/m2 or greater, 0.5 J/m2 or greater, 1 J/m2 or greater, 1.5 J/m2 or greater, or 2 J/m2 or greater.

Bonding strength can be converted to the energy of the bonding interface as previously described. Bonding strength may be measured as the fracture strength of the bonding interface, or may be measured as a fracture strength of the bonding interface. The blade insertion method can easily be applied to the bonding substrates of a material that is hard to plastic deformation to some extent, such as a semiconductor wafer or a glass substrate. On the other hand, in the case of a substrate made of a polymeric material, the bonding strength may be measured by a peel test. The fracture strength may be measured by a peel test to evaluate the bonding strength. In the peeling method, the bonding strength may be 0.5 N/cm or greater.

Since the transparent substrate laminate included in the present disclosure does not contain an organic material such as OCA and is composed of only an inorganic material, it can be applied to a range of applications and devices where an organic material is not preferred. The transparent substrate laminate included in the present disclosure may be used for a transparent panel used in space where the resistance to radiation such as alpha rays is required. The present disclosure includes optoelectronic devices with transparent substrate laminate, solar cells, solar cells for space applications, radiation-resistant solar cells, and radiation-resistant photoelectronic devices. The present disclosure also includes aeronautical devices or aircraft bodies, such as aircraft, satellites, rockets, space stations, etc., window materials or windows used in architectural applications, pressure-resistant glass, etc., including such a transparent substrate laminate.

<Heat Treatment>

As described above, the substrate laminate formed by bonding substrates was further heated at 100° C., 150° C. or 200° C. It was confirmed that the bonding strength after heating is generally higher, compared with the bonding strength without heating. The atmosphere in the heat treatment may be the atmosphere, and may be an inert gas such as nitrogen or argon.

As a bonding method of a transparent substrate, a technique is known in which a thin film of metal is formed on a bonding surface of a transparent substrate, a substrate is bonded through the metal thin film, and a metal is absorbed by the substrate by irradiating a laser to a metal thin film sandwiched between the substrates, so that a substrate laminate having a relatively high transparency is obtained. However, in this approach, the metal may not be completely absorbed by the substrate, and problems may occur with light transmittance. In addition, in electronic display devices such as smartphones, a polymer film including an organic EL element or the like is often bonded to a transparent substrate. Laser heating, however, is not suitable for relatively low-resistance materials and components such as polymeric films. On the other hand, the method of forming the laminate of the present disclosure is also suitable for bonding a polymer film because it is not necessary to inject high energy into the bonding interface. Further, it is not necessary to interpose an OCA, and a laminate having high transparency and high adhesion and high transparency can be formed.

The substrates to be bonded may be flat or planar, or may have a non-flat shape. The substrates to be bonded may include tempered glass in a curved shape, or may include tempered glass having a curved surface. Substrates to be bonded or laminates may have a L-shaped cross section, a U-shaped cross section, or an arcuate cross section. These substrates and the laminates may be used in electronic display devices, such as three-dimensional shaped smartphones, tablets, and the like, having a display or optical elements on a curved surface or on a side surface.

The other substrate or the second substrate to be bonded may be a flexible substrate or may include a flexible substrate. The flexible substrate may include an optical element.

It is difficult to use OCA for the substrate which is weak to bend or has a large curvature. The methods of bonding a substrate of the present disclosure can avoid the use of OCA, and can directly bond a cover glass and a functional film such as a deflection film via a metal oxide film, thereby making it possible to form a laminate having high transparency while solving the above-mentioned drawbacks.

In yet another embodiment, both of the pair of substrates to be bonded may be glass substrates, and one or the first substrate may be a glass substrate, and the second substrate may be a glass substrate having a bonding area smaller than the first substrate. In still further embodiments, the second substrate may be a glass substrate having a frame shape along the edge of the first substrate. The second substrate may also be bonded to a portion of the edge of the first substrate. For example, the first substrate may be a generally rectangular planar glass substrate. The second substrate may be bonded along a pair of opposing sides of the first substrate. In this case, the second substrate may include a plurality of substrates. All glass substrates in the present disclosure may consist of tempered glass and may be a substrate comprising tempered glass.

The methods of bonding substrates included in the present disclosure may further comprise: wherein the first substrate is a glass substrate or a substrate including a glass substrate; the second substrate is a substrate having a bonding surface bonded to a part or the whole of an edge of the first substrate; and after the first substrate and the second substrate are bonded to each other, the bonded first substrate and second substrate are machined to form a curved glass substrate.

Alternatively, the method of bonding substrates included in the present disclosure may include machining the first substrate and the second substrate that are bonded to each other, to form a curved surface on at least a part of the first substrate and the second substrate. The machining may include at least one of a grinding process and a polishing process. Machining may be performed in a manner that avoids bending. Since general tempered glass is weak to bending and its bending is difficult, there is a problem that bent tempered glass becomes expensive. On the other hand, according to the above method, this problem can be solved, and a curved glass substrate or a curved tempered glass substrate having a desired curved surface shape can be formed without bending or deformation at a high temperature.

Figure 3A:
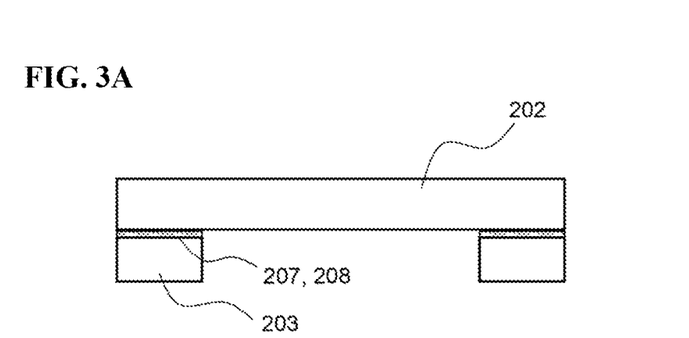
FIGS. 3A, 3B and 3C are schematic cross-sectional views illustrating each step of a method of forming a laminate according to another embodiment.
Figure 3B:
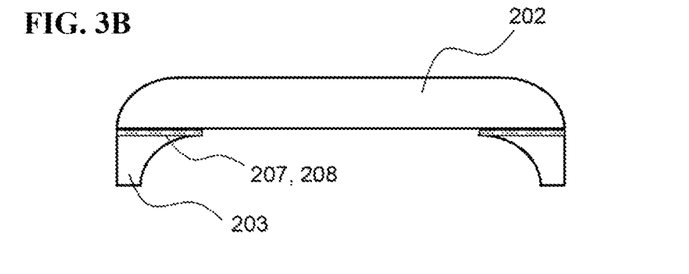
Figure 3C:
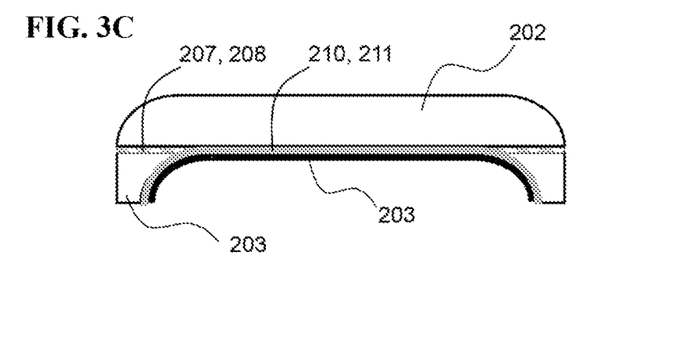

In a further embodiment, the substrate bonding method includes: forming first metal oxide thin films 207, 208 on the bonding surface of the first substrate 202 and the first bonding surface of the second substrate 203; performing a first activation treatment on surfaces of the first metal oxide thin films 207, 208 on the bonding surface of the first substrate 202 and the first bonding surface of the second substrate 203; contacting the bonding surface of the first substrate 202 and the first bonding surface of the second substrate 203 with each other via the metal oxide thin films 207, 208, to bond the first substrate 202 and the second substrate 203; forming second metal oxide thin films 210, 211 on the second bonding surface of the second substrate 203 and the bonding surface of the third substrate 209; performing a second activation treatment on second metal oxide thin films 210, 211 on the second bonding surface of the second substrate 203 and the bonding surface of the third substrate 209; and bringing the second bonding surface of the second substrate 202 and the bonding surface of the third substrate 209 into contact with each other, to bond the second substrate 203 and the third substrate 209 to each other. (FIGS. 3A, 3B and 3C)

In the method of bonding the substrates, the third substrate 209 may be bonded to the first substrate 202. The third substrate 209 may be bonded to the first substrate 202 and the second substrate 203. That is, the method may include bringing the bonding surface of the third substrate 209 into contact with the second bonding surface of the first substrate 202 and the second bonding surface of the second substrate 202, to bond the first substrate 201 and the second substrate 203 to the third substrate 209.

The first substrate 202 and the second substrate 203 may be transparent substrates, substrates of tempered glass, or substrates including tempered glass. In yet another embodiment, the third substrate may be a flexible substrate. As described above, it is difficult to bend a flat tempered glass, or a bent tempered glass is expensive. Therefore, it is possible to produce an electronic display device which is cheaper and has high light extraction efficiency.

The present disclosure also includes electronic or optoelectronic or optical devices, or general devices, fabricated by methods including any of the substrate bonding methods disclosed in this application. In some embodiments, the device may comprise a laminate manufactured in a method comprising a substrate bonding method of any of the present disclosure. In a further embodiment, the device may comprise an organic EL element. In still further embodiments, the device may be a smart phone, a display device, a solar cell, a SAW filter device, or may be a building material such as a window, a pressure-resistant glass, etc.

While several embodiments and examples of the present invention have been described above, these embodiments and examples exemplify the present invention. It is intended that the claimed inventions cover numerous modifications to the embodiments without departing from the technical spirit and scope of the present invention. Accordingly, the embodiments and examples disclosed herein have been shown by way of examples and should not be considered as limiting the scope of the present invention.

The invention claimed is:

1. A method of bonding substrates, each substrate having a bonding surface, the method comprising:
   irradiating both or at least one of the bonding surfaces of a pair of substrates with energy particles which are a mixed gas comprising an inert gas and oxygen, the mixed gas having a flow rate ratio of $O_2/(Ar+O_2)$ in a range of from 3.75 to 8.75%, before forming a thin film on both or at least one of the bonding surfaces;
   forming a thin film of a metal oxide on both or at least one of the irradiated bonding surfaces of the pair of substrates at least one of which is a transparent substrate, comprising forming the thin film by sputtering the metal oxide as a target and a mixed gas comprising an inert gas and oxygen; and
   contacting the bonding surfaces of the bonding substrates with each other via the thin film of the metal oxide.

2. The method of claim 1, wherein the forming comprises ion beam sputtering.

3. The method of claim 1, further comprising:
   irradiating the surface of the thin film of the metal oxide with energy particles.

4. The method of claim 3, comprising, in the irradiating, irradiating energy particles of a mixed gas substantially consisting of an inert gas and an oxygen gas.

5. The method of claim 1, wherein at least the forming to the contacting are performed in a vacuum.

6. The method of claim 1, further comprising:
   performing a heat treatment after bonding the substrates.

7. The method of claim 6, wherein the heat treatment is performed at 200° C. or lower.

8. The method of claim 1, wherein at least one of the substrates is a transparent glass substrate.

9. The method of claim 1, wherein one of the substrates is a transparent glass substrate and the other is a substrate comprising an optical element.

10. The method of claim 1, wherein at least one bonding surface of the substrates substantially consists of a polymer material.

11. A device, comprising:
    a substrate laminate formed by the method of claim 1.

12. The method of claim 1, wherein the irradiating further comprises:
    irradiating both of the bonding surfaces of the pair of substrates.

13. The method of claim 1, wherein the forming further comprises:
    forming the thin film on both of the bonding surfaces of the pair of substrates.

14. The method of claim 1, wherein at least the forming to the contacting is performed under an atmospheric pressure of $10^{-5}$ Pa or less.

15. A method of bonding a first substrate having a first bonding surface and a second substrate having a second bonding surface, the method comprising:
    irradiating the first and/or second bonding surface with energy particles of a mixed gas comprising an inert gas and oxygen;
    forming a thin film of a metal oxide directly on the first and/or second bonding surface irradiated via atomic layer deposition or via sputtering a metal as a target and a mixed gas comprising an inert gas and oxygen; and
    contacting the first and second bonding surfaces of the substrates with each other via the thin film of the metal oxide.

16. The method of claim 15, comprising
    irradiating the first and second bonding surface, and/or
    forming the thin film of the metal oxide on the first and second bonding surface.

17. The method of claim 15, wherein the forming comprises ion beam sputtering.

18. The method of claim 15, wherein the forming comprises the atomic layer deposition.

19. The method of claim 15, wherein the first and second substrates are transparent glass.

20. The method of claim 15, wherein the first substrate is a transparent glass substrate and the second substrate comprises an optical element.

* * * * *